United States Patent
Lu

(10) Patent No.: US 11,677,269 B2
(45) Date of Patent: Jun. 13, 2023

(54) SYSTEMS AND METHODS FOR HARVESTING VIBRATION ENERGY USING A HYBRID DEVICE

(71) Applicant: Baker Hughes Oilfield Operations LLC, Houston, TX (US)

(72) Inventor: Dan Tho Lu, Minden, NV (US)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 636 days.

(21) Appl. No.: 16/681,445

(22) Filed: Nov. 12, 2019

(65) Prior Publication Data

US 2021/0143759 A1 May 13, 2021

(51) Int. Cl.
 *H02J 50/00* (2016.01)
 *H02N 2/18* (2006.01)
 *H02J 3/28* (2006.01)

(52) U.S. Cl.
 CPC .............. *H02J 50/001* (2020.01); *H02J 3/28* (2013.01); *H02N 2/181* (2013.01); *H02N 2/188* (2013.01)

(58) Field of Classification Search
 CPC . H02N 2/188; H02N 2/181; H02J 3/28; H02J 7/025; H02J 2207/50; H02J 50/001; H01L 41/113
 See application file for complete search history.

(56) References Cited

U.S. PATENT DOCUMENTS

| | | | |
|---|---|---|---|
| 8,009,059 B2 | 8/2011 | Huang | |
| 9,470,497 B2 * | 10/2016 | Rastegar | F42C 11/02 |
| 10,205,409 B1 * | 2/2019 | Meloche | H02N 2/186 |
| 10,352,100 B2 | 7/2019 | Nguyen | |
| 2001/0040379 A1 * | 11/2001 | Schultz | F03G 7/08 290/1 R |

(Continued)

FOREIGN PATENT DOCUMENTS

JP 2012-062688 A 3/2012
KR 10-2014-0137761 A 12/2014

OTHER PUBLICATIONS

International Search Report and Written Opinion for International Patent Application No. PCT/US2020/059797, dated Feb. 26, 2021, 10 pgs.

*Primary Examiner* — Daniel Kessie
*Assistant Examiner* — Brian K Baxter
(74) *Attorney, Agent, or Firm* — Sprinkle IP Law Group

(57) ABSTRACT

Hybrid energy harvesting devices that harvest vibrational energy over a broad frequency spectrum using several different energy harvesting mechanisms that are operable over different frequency ranges. In one embodiment, a device uses an inductive current generator to convert vibrational energy at lower frequencies to electrical energy, and also uses one or more piezoelectric charge generators to convert vibrational energy at higher frequencies to electrical energy. The electrical energy produced by these different mechanisms is provided to a controller which processes the input energy and generates an output which is applied to an energy store such as a battery. The energy stored in the battery can then be drawn by a wireless sensor or other device. The energy harvesting device may have the same form factor as a conventional battery to allow installation in battery-powered equipment without modification.

15 Claims, 3 Drawing Sheets

(56) References Cited

U.S. PATENT DOCUMENTS

| | | | |
|---|---|---|---|
| 2007/0210580 A1* | 9/2007 | Roberts | H02P 9/006 290/1 R |
| 2008/0001578 A1* | 1/2008 | Cap | H02K 7/1853 322/3 |
| 2008/0054638 A1* | 3/2008 | Greene | H02J 50/001 290/1 R |
| 2009/0152951 A1* | 6/2009 | Algrain | H02J 9/066 307/65 |
| 2009/0315431 A1* | 12/2009 | Rastegar | H02N 2/18 310/331 |
| 2010/0045119 A1* | 2/2010 | Jackson | H02K 7/1876 310/20 |
| 2010/0133813 A1* | 6/2010 | Cote | H02P 9/04 290/46 |
| 2011/0133488 A1* | 6/2011 | Roberts | H02K 35/06 322/3 |
| 2011/0193350 A1* | 8/2011 | Rastegar | H02N 2/18 290/1 R |
| 2013/0026978 A1* | 1/2013 | Cooley | H01M 10/0568 307/43 |
| 2014/0021825 A1* | 1/2014 | Ocalan | H03H 11/481 310/300 |
| 2015/0295520 A1* | 10/2015 | Hasegawa | H02N 2/188 310/323.01 |
| 2016/0079886 A1* | 3/2016 | Hasegawa | H05B 47/165 310/319 |
| 2016/0152252 A1* | 6/2016 | Kim | B61L 15/0081 701/31.4 |
| 2016/0197261 A1* | 7/2016 | Abdelkefi | H02N 2/188 29/25.35 |
| 2017/0179715 A1* | 6/2017 | Huang | H02M 3/155 |
| 2017/0179850 A1* | 6/2017 | Ong | F03G 7/08 |
| 2017/0250627 A1* | 8/2017 | Hasegawa | H02N 2/188 |
| 2019/0378968 A1* | 12/2019 | Fukui | H01L 41/1136 |
| 2022/0094253 A1* | 3/2022 | Houston | H02K 7/003 |

* cited by examiner

SYSTEMS AND METHODS FOR HARVESTING VIBRATION ENERGY USING A HYBRID DEVICE

BACKGROUND

Field of the Invention

The invention relates generally to energy generation, and more particularly to systems and methods for generating electrical energy from vibrations using a self-contained apparatus that employs multiple energy conversion mechanisms that are effective in different frequency ranges.

Related Art

Wireless devices for sensing and communication have become very popular in industrial environments for a number of reasons. For example, sensors are conventionally connected to electronic devices (e.g., monitors, controllers, etc.) by wires that carry signals from the sensors to the corresponding devices. While this may not necessarily be impractical for a few sensors, it may be necessary or desirable in some systems to have hundreds, or even thousands of sensors measuring various conditions or characteristics, such as pressure, temperature and vibration levels or machines or process materials. If each of the sensors has a corresponding wired connection, there will be hundreds or thousands of wires, which will increase the size, weight, cost and complexity of the system. Additionally, the sensors may be located in hazardous environments, so it may be desirable to avoid having wires or cables that would be exposed to the hazardous environment, or which would potentially expose the environment to electrical energy.

It is therefore often advantageous to use wireless systems for sensing and communication of sensor data. Wireless systems, however, require a local energy source to provide power for the sensors and related communication devices. Typically, these wireless systems use batteries, but batteries have a limited lifetime and after their energy is expended, the batteries must be replaced. Frequently, the conditions that make it advantageous to use a wireless device also make it difficult to replace the batteries for these devices. For example, when a wireless sensor is used in a hazardous environment, the process of replacing the battery for the sensor may involve taking the sensor out of service, venting the area in which the sensor is installed, removing the sensor to a safe area, replacing the sensor's battery, and reinstalling the sensor. This process may be inconvenient, tedious, time-consuming and expensive. When many wireless sensors are used, these problems are multiplied, as the process for replacing the batteries must be carried out for many devices.

Various alternative energy sources have been used in place of batteries. For instance, some applications allow for the use of solar cells that harvest radiated energy from the sun and convert this energy to electricity. The effectiveness of solar CELLS depends on a number of factors, such as exposure of the solar cells to sunlight, the positioning of the solar cells, and the angle of the solar cells with respect to the impinging sunlight. These factors may change as the sun changes positions in the sky. Additionally, since solar cells generally require exposure to sunlight, it is often necessary to mount the solar cells on the roof of a building and then connect the solar cells to the sensors or other devices which require power, which to some extent defeats the purpose of using the wireless devices.

In other systems, energy harvesters have been devised to convert vibrational energy to electrical energy. These devices typically are not integral to the wireless sensor or device, and are not available in a package that can be conveniently installed in such a device. Often, vibration energy harvesters are manufactured as a standalone device that has to be mounted exterior to a piece of equipment (e.g., on the surface of an engine case) with a cable running from the energy harvester to the sensor. Energy harvesters that are to be mounted on a device already in the field are commonly required to be mounted separately from the device and electrically connected to the device by power cables or wires. The efficiency of conventional vibrational energy harvesters is commonly very much dependent on the specific vibration environment in which they are used, as they are typically tuned to a specific (e.g., resident) frequency of vibration and are not able to generate significant amounts of electrical energy from vibrations at frequencies which differ substantially from the tuned frequency.

Other systems may use devices that are configured to harvest thermal energy, and to convert this energy to electrical energy for use by a wireless sensor or other device. These thermal energy harvesting devices have varying efficiencies, depending upon factors such as, for example, the temperature of the environment and the temperature of the device on which it is mounted (e.g., an engine). Still other types of energy harvesting devices may also be used. Each of these devices has its own benefits and disadvantages.

It would be desirable to provide energy harvesting devices that reduce or eliminate one or more of the disadvantages of these conventional devices.

SUMMARY

This disclosure is directed to systems and methods for generating electrical energy from vibrational energy that reduce or eliminate one or more of the problems above. Generally, these systems and methods involve providing hybrid energy harvesting mechanisms in a conventional form factor to facilitate their use in devices designed to use conventional batteries for power.

Embodiments of the present invention harvest vibrational energy over a broader frequency spectrum than prior art devices by employing several different energy harvesting mechanisms to generate electrical energy. In an exemplary embodiment, an energy harvesting device uses an inductive current generator to convert vibrational energy at lower frequencies to electrical energy, and also uses one or more piezoelectric charge generators to convert vibrational energy at higher frequencies to electrical energy. The electrical energy produced by these different harvesting mechanisms is provided to a controller which processes the input energy and generates an output which is applied to an energy store such as a battery. The energy stored in the battery can then be drawn as needed by an electrical device such as a wireless sensor or transmitter. The energy harvesting device may be configured as a package that has the same form factor as a conventional battery (e.g., a D-cell battery) which may be conveniently used in equipment that is adapted to use this conventional battery without having to modify the equipment to use the energy harvesting device.

One embodiment comprises an energy harvesting apparatus having first and second electrical generators configured to generate electrical energy from vibrations in a first and second frequency ranges, respectively, an energy store such as a rechargeable battery or supercapacitor, and an electrical controller. The electrical generators are configured to provide generated electrical energy to the electrical controller which includes a processor circuit configured to generate output power. This output power is provided to the energy store, thereby charging the energy store. The energy harvesting apparatus is coupled to a device such as a wireless sensor or transceiver, which draws energy from the energy store to operate the device.

In one embodiment, the first electrical generator comprises an inductive current generator having a magnet and a coil, where movement of the coil with respect to the magnet induces current in the coil. The magnet is held in a substantially stationary position within a housing of the energy harvesting apparatus. The coil is positioned within the housing of the energy harvesting apparatus and is electrically coupled to the electrical controller. The coil is movable with respect to the magnet (in response to vibrations experienced by the apparatus), where movement of the coil with respect to the magnet induces current in the coil which is provided to the controller. In one embodiment, the magnet of the energy harvesting apparatus has a cylindrical shape, and the coil is wound on a cylindrical support that is coaxially positioned around the magnet. The cylindrical support is connected in this embodiment to a frame of the apparatus by one or more springs, and is axially movable with respect to the magnet in response to the vibrations experienced by the apparatus. The apparatus may also have a magnetically permeable cylinder coaxially positioned around the cylindrical support, the magnetically permeable cylinder being positioned in fixed relation to the magnet.

In one embodiment, the second electrical generator of the energy harvesting apparatus is a piezoelectric charge generator having one or more piezoelectric plates. The magnet in this embodiment provides a proof mass which is positioned to apply pressure to the one or more piezoelectric plates when the magnet experiences vibrations. The piezoelectric plates are electrically coupled to provide charge generated by the plates to the electrical controller. The piezoelectric plates may include a first set of plates that generate charge responsive to vibrations within the second frequency range of frequencies, and a second set of plates that generate charge responsive to vibrations within a third frequency range. The apparatus may also include one or more conductive spacers positioned between the piezoelectric plates.

In one embodiment, the energy harvesting apparatus includes a housing that contains the first electrical generator, the second electrical generator, the energy store, and the electrical controller. A positive electrical contact for the energy store is provided at a first end of the housing and a negative electrical contact for the energy store is provided at a second end of the housing opposite the first end of the housing. The housing may have a form factor of a conventional battery, such as a C cell battery or a D cell battery. This facilitates installation of the energy harvesting apparatus in a battery compartment of a wireless sensor or other device, which may be mounted on a motor or other vibrating device to receive the vibrations from the device.

Numerous other embodiments may also be possible.

BRIEF DESCRIPTION OF THE DRAWINGS

Other objects and advantages of the invention may become apparent upon reading the following detailed description and upon reference to the accompanying drawings.

Figure 1:
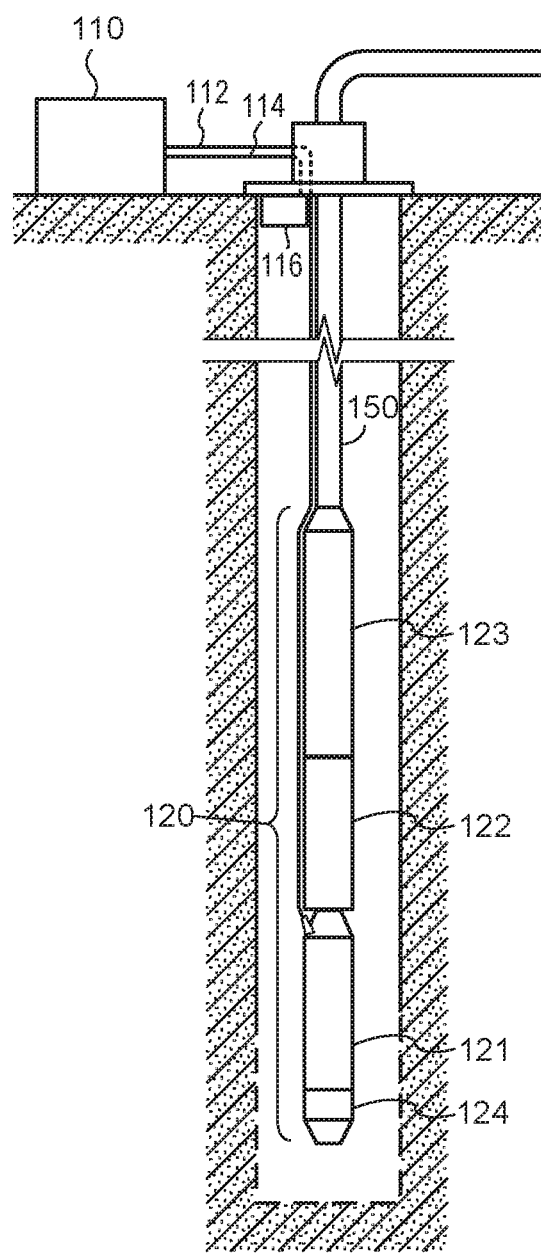
FIG. 1 is a diagram illustrating an exemplary implementation of an energy harvesting device in an ESP system in accordance with some embodiments.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for harvesting vibrational energy in multiple frequency ranges using a combination of harvesting mechanisms and converting the harvested vibrational energy to electrical energy which is stored for use by an electrical device.

In an exemplary embodiment, a hybrid energy harvesting device is installed in a wireless sensor which is coupled to a motor, such as the motor of an electric submersible pump (ESP). It should be noted that in other embodiments, energy harvesting devices may be installed in other types of devices that are coupled to other types of equipment in which the energy harvesting device will be subject to vibration.

The energy harvesting device includes two different types of electrical energy generators: an inductive current generator; and piezoelectric charge generator. The Inductive current generator includes a stationary permanent magnet and one or more coils of magnet wire that are installed on a movable, spring-mounted support structure (collectively referred to as the coil structure). In this embodiment, the magnet and the coil structure are both generally cylindrical, with the coil structure being positioned coaxially around the magnet. As the device experiences vibrations, the vibrations cause the coil structure to move up and down in an axial direction, with the wires of the coils passing through the flux lines of the magnet and thereby inducing currents in the coils.

The second type of electrical energy generator is the piezoelectric charge generator. The piezoelectric charge generator includes a set of discs made of a piezoelectric material. These discs are positioned on opposite ends of the permanent magnet, with a conductive material separating each of the discs. The permanent magnet serves as the conductive material between two of the piezoelectric discs. This stack further includes a pair of conductive discs at opposing ends of the stack which hold the stack in a substantially fixed position. As the device experiences vibrations, the vibrations cause the magnet to apply pressure to the piezoelectric discs, thereby causing the discs to produce electrical charge.

The piezoelectric discs and the coils are electrically connected to power processing and management circuitry (which may be referred to herein simply as a controller) which processes the charge generated by the piezoelectric discs and the electrical current generated by the coils. The controller uses the generated charge and current to generate an electrical potential that is applied to a battery which is incorporated into the energy harvesting device. This potential charges the battery, which can then be used as an energy source to drive the wireless sensor or other electrical device in which it is installed.

In some embodiments, the energy harvesting device is integrated into a package that has the same form factor (i.e., external configuration, such as size and shape) as a conventional battery. For example, the energy harvesting device may be the same size and shape as a D-cell battery, with a positive electrical contact at one end and a negative electrical contact at the other end. Since wireless devices are commonly designed to be powered by conventional batteries, providing the energy harvesting device in this type of package allows the device to be installed in many wireless devices in the same way a conventional battery is installed in a battery compartment of the wireless device, thereby eliminating the need to modify the designs of either the wireless devices or the energy harvesting device to allow the energy harvesting device to be incorporated into the wireless device.

Referring to FIG. 1, a diagram illustrating an exemplary implementation of an energy harvesting device in an ESP system is shown. In this embodiment, an ESP system is installed in a well for the purpose of producing hydrocarbons such as oil, or other fluids. The ESP 120 is coupled to the end of tubing string 150, and the ESP and tubing string are lowered into the wellbore to position the ESP in a producing portion of the well. Surface equipment which includes an electric drive system 110 is positioned at the surface of the well. Drive system 110 is coupled to ESP 120 by power cable 112, which runs down the wellbore along tubing string 150.

In this embodiment, ESP 120 includes a motor section 121, a seal section 122, and a pump section 123. ESP 120 also includes a gauge package 124 that includes an energy harvesting device to provide power for one or more electronic components such as a wireless sensor and transmitter. Motor section 121 is coupled to power cable 112, and is driven by AC power (typically three-phase AC power) that is received from drive system 110 through the cable. Motor section 121 is coupled to pump section 123 through seal section 122 to drive the pump section, thereby pumping the oil or other fluid through the tubing string and out of the well. Seal section 122 is provided between motor section 121 and pump section 123 for purposes including equalizing the pressure between the motor interior and the well bore and allowing the oil within the motor to expand and contract.

In this embodiment, power for the electronic components of the gauge package is provided by an energy harvesting device that is configured to convert vibrational energy to electrical energy. The gauge package may include a sensor that is configured to sense a condition such as temperature or pressure in the motor or the well environment. The sensor data may be provided to a transmitter that is configured to transmit the data to a receiver 116 at the surface of the well. Receiver 116 may then communicate the received data to a monitor or other component of surface equipment 110 via a wired interconnect 114.

It should be noted that the ESP system described here is merely an illustrative application for the disclosed energy harvesting devices. These devices may be used in connection with other downhole devices that are subject to vibrations, surface equipment (including motors or other mechanical equipment), or any other environments in which the devices are exposed to vibrational energy that may be converted to electrical energy. Additionally, the specific configurations of the generators described herein are illustrative, and alternative embodiments may have different form factors, different generator types and designs, different numbers of generator components, and so on.

Figure 2:
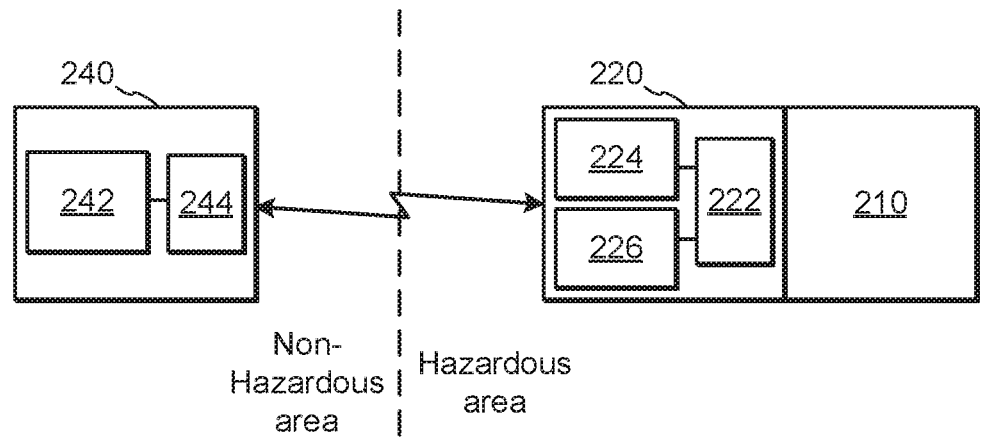
FIG. 2 is a diagram illustrating the general structure of a system using an energy harvesting device to power a wireless sensor/transmitter in accordance with some embodiments.

Referring to FIG. 2, a diagram illustrating the general structure of a system using an energy harvesting device to power a wireless sensor/transmitter in accordance with some embodiments is shown. This diagram depicts a more general implementation of the energy harvesting device. On the right side of the figure is a piece of equipment 210 that is subject to vibration, either because the equipment itself vibrates during operation, or because it is exposed to vibration in the environment in which it operates. As noted above, an electric motor is an example of a piece of equipment that generates vibrations as it operates.

A wireless sensor system 220 is coupled to equipment 210. The wireless sensor system may be incorporated into the design of equipment 210, or it may be externally coupled to the equipment. For example, a standalone wireless sensor unit may be secured to a housing of equipment 210. In either case, wireless sensor system 220 is caused to vibrate, such as when equipment 210 is operated and generates vibrations. These vibrations are communicated to energy harvesting device 222, which is secured within the wireless sensor system. The vibrations are in turn communicated to the internal components within energy harvesting device 222, which convert the vibrational energy to electrical energy.

Energy harvesting device 222 is a hybrid device which includes multiple electrical energy generators that are operable within different ranges of frequencies. The electrical energy produced by each of the generators is processed by circuitry within the energy harvesting device which is configured to convert this energy to a suitable voltage for charging a battery, which is also contained within the energy harvesting device. In this example, wireless sensor system 220 includes a sensor component 224 and a transmitter component 226. Each of these components is coupled to energy harvesting device 222 so that they can draw power from the charged battery.

As depicted in FIG. 2, equipment 210 and wireless sensor system 220 may be located in an area (to the right of the dashed line in the figure) which is inaccessible, inconvenient or impractical to access. This area may be downhole in a well, in a location that contains hazardous gases, or another area which is difficult to access. Consequently, the components of the wireless sensor system (sensor 224 and transmitter 226 in this embodiment) are powered by energy harvesting device 222, and do not require a connection to an external power source. Sensor 224 draws power from the battery of energy harvesting device 222 to sense conditions related to equipment 210 or its environment. Transmitter 226, which also draws power from the battery of energy harvesting device 222, receives data from sensor 224 and wirelessly communicates this data to a receiver 244 of monitoring unit 240. Receiver 244 may then provide the data to monitoring circuitry 242 within the unit. In this example, monitoring unit 240 is located in an area (e.g., the surface of a well) which is not inaccessible/inconvenient/impractical to access, so it may be conventionally powered (i.e. may draw power from a power grid, generator, battery, or other conventional means).

Figure 3:
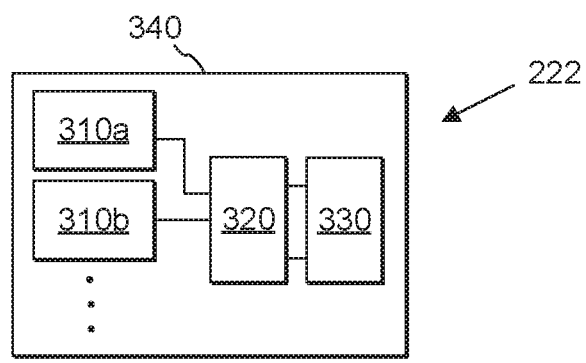
FIG. 3 is a diagram illustrating the general structure of an energy harvesting device in accordance some embodiments.

Referring to FIG. 3, a diagram illustrating the general structure of an energy harvesting device in accordance with some embodiments is shown. In this embodiment, energy harvesting device 222 includes multiple energy generators (310*a*, 310*b*, . . . ) which are configured to convert vibrational energy into electrical energy. Each of the energy generators is designed to be effective in a different range of frequencies so that the device can more effectively convert vibrational energy into electrical energy, as compared to conventional vibrational energy harvesting devices which are typically designed for particular applications and which are tuned to convert vibrations within a relatively narrow band of frequencies (e.g., around the running frequency of the equipment on which it is mounted). In one embodiment, a first one of the generators uses an induction mechanism to convert vibrations at lower frequencies (e.g., up to a few hundred Hz) to electrical current, while a second one of the generators uses a piezoelectric mechanism to convert vibrations at higher frequencies (e.g., several hundreds of Hz to several thousands of Hz). Other electrical generators within the energy harvesting device may be configured to use the same or different energy conversion mechanisms, and may be responsive to vibrations in various frequency ranges (which may be the same, different, or overlapping to various degrees).

Each of electrical energy generators 310 is connected to a controller or power management circuit 320. Controller 320 is designed to receive the outputs of the different generators and to convert the received electrical energy to a form which is suitable to charge an energy store 330, which may be a rechargeable battery, supercapacitor ("supercap") or other type of energy storage device. (References herein to a battery in the energy harvesting device should be broadly construed to include the various different types of energy stores that may be available for use in the device.) Thus, controller 320 may include circuitry configured to convert varying AC currents generated by an induction-type generator to a DC voltage that is suitable for charging the battery, and may include separate circuitry configured to convert the charge generated by a piezoelectric-type generator to the DC voltage needed to charge the battery.

"Supercapacitor" or "supercap" is used herein to refer to a type of high-capacity capacitor which typically has a very high capacitance value and a relatively low voltage limit. Supercaps can therefore be used in a manner which is similar to a rechargeable battery.

Electrical energy generators 310, controller 320 and energy store 330 are packaged within a housing 340. Housing 340 is a substantially rigid structure that has the form of a conventional battery. Wireless devices and other devices that require a local/internal source of power are commonly configured to use conventional C cell or D cell batteries, so housing 340 may be designed to have the same size and shape as one of these battery types. This allows the energy harvesting device to be installed in one of these wireless or other battery-powered devices in the same manner as a conventional battery. By contrast, existing energy harvesting devices typically have form factors which are driven by the design of the energy harvesting mechanisms within the devices. These devices may have many different package sizes and different connectors. Therefore, in order to use these prior art energy harvesting devices in a wireless or other device, it is typically necessary to modify the wireless device to accommodate the particular package and connectors of the energy harvesting devices.

Figure 4:
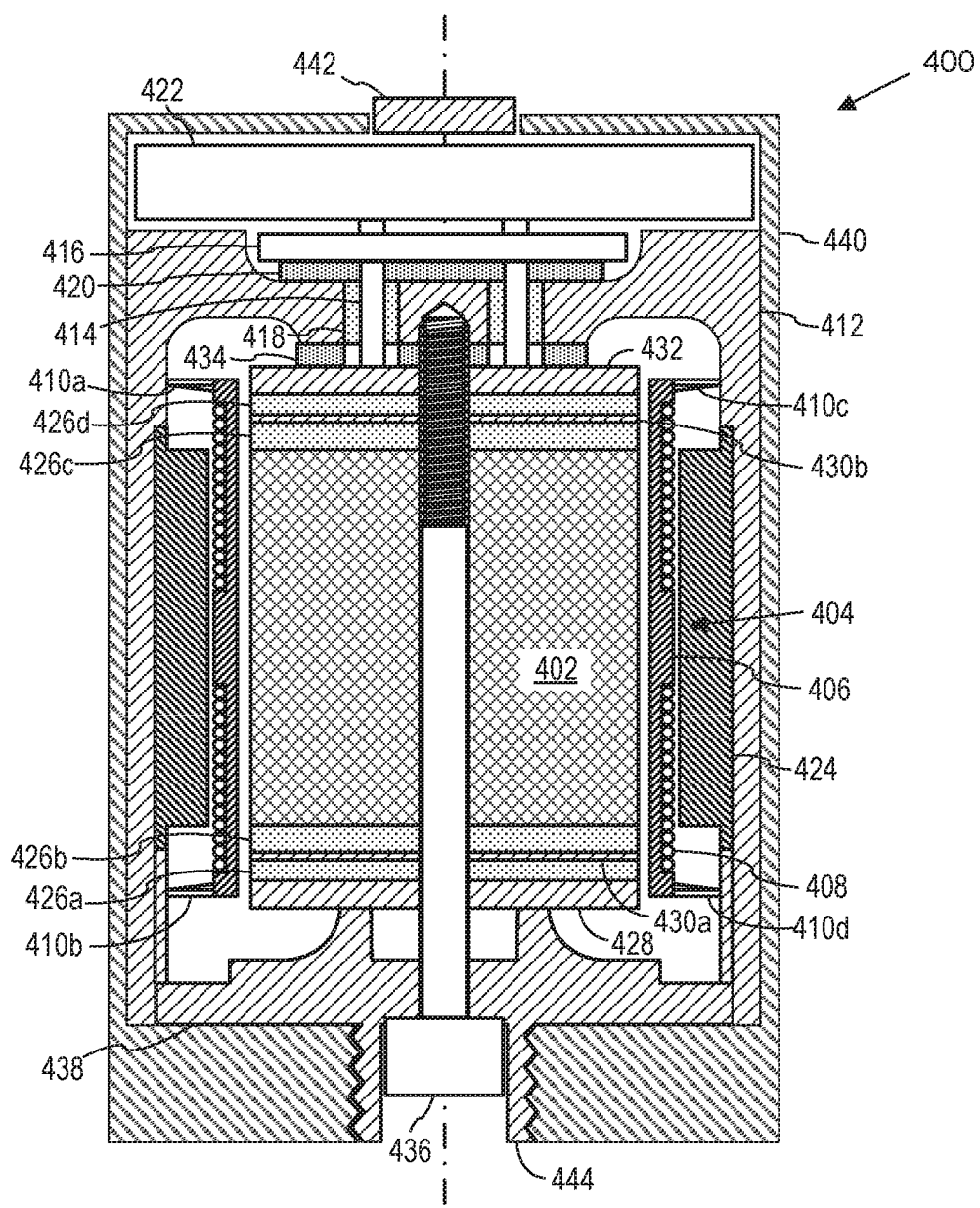
FIG. 4 is a diagram illustrating the detailed structure of an exemplary energy harvesting device in accordance with some embodiments.

Referring to FIG. 4, a diagram illustrating the detailed structure of an exemplary energy harvesting device in accordance with one embodiment is shown in more detail. In this embodiment, exemplary energy harvesting device 400 includes three different mechanisms for converting vibrational energy to electrical energy: an induction mechanism effective in a first frequency range; a first piezoelectric mechanism effective in a second frequency range; and a second piezoelectric mechanism which is effective in a third frequency range. The induction mechanism uses one or more coils which are caused by vibrations to move within the fields of a permanent magnet, thereby inducing currents in the coils. These currents are provided to a power management circuit which processes the currents and generates a DC voltage to charge a rechargeable battery within the harvesting device. The first piezoelectric mechanism uses a set of high sensitivity piezoelectric ceramic discs in conjunction with the permanent magnet. Vibrations cause the permanent magnet to press against the piezoelectric discs, thereby causing them to generate charge which is provided to the power management circuit. The power management circuit in turn uses the generated charge to produce a DC voltage for charging the battery. The second piezoelectric mechanism operates in the same manner as the first piezoelectric mechanism, but the piezoelectric discs are configured to generate charge more effectively in response to vibrations within a different frequency range than the first piezoelectric mechanism.

As noted above, the inductive current generator of energy harvesting device 400 employs a stationary permanent magnet 402 and a moving coil structure 404. Magnet 402 is generally cylindrical in shape, with a concentric hole therethrough. The magnet is held in position by the discs of the piezoelectric charge generator components, as will be discussed in more detail below. A steel cylinder 424 is positioned coaxially around coil structure 404 and is secured to electrically conductive frame 412 so that it is stationary. Cylinder 424 is magnetically permeable, so it causes the magnetic flux of magnet 402 to be more concentrated in the area adjacent to coils 408.

Coil structure 404 consists of a generally tubular cylindrical coil support structure 406 on which a set of coils 408 are wound. In this embodiment, two coils are wound on support structure 406 and connected to controller 416 to double the induced voltage of the coils. Coils 408 are connected via corresponding electrical leads 414 to an electrical controller 416 which includes power management circuitry. Leads 414 are electrically isolated from frame 412 by insulators 418. Controller 416 may itself be isolated from the frame by insulator 420. Insulators 418 and 420 may be formed using glass, epoxy, or any other suitable insulating material.

Coil structure 404 is movable axially (up and down in the figure) with respect to magnet 402. Coil structure 404 is connected by a set of spiral springs 410*a*-410*d* to a frame 412 so that the coil structure will oscillate axially when device 400 experiences vibrations. As coil structure 404 moves with respect to magnet 402, coils 408 cut through the magnetic flux lines of the magnet, which induces current in the coils. This current is applied to the corresponding inputs of controller 416, and is processed by the controller's power management circuitry. Controller 416 processes the current and uses the received electrical energy to generate a desired DC voltage, which is typically higher than the voltage of the received energy. The DC voltage generated by controller 416 is applied to energy store 422 which stores the received electrical energy. Energy store 422 may be a rechargeable battery, supercapacitor, or any other suitable means to store the electrical energy.

The piezoelectric current generators of energy harvesting device 400 employ high sensitivity piezoelectric ceramic discs to generate charge from vibrations experienced by the device. In this embodiment, the energy harvesting device has four annular piezoelectric discs 426. The piezoelectric discs are stacked together with a set of annular conductive discs. A metal support disc 428 is positioned at the bottom of the stack. Piezoelectric disc 426*a* is positioned on top of support disc 428, an electrically conductive spacer 430*a* is positioned on top of disc 426*a*, and piezoelectric disc 426*b* is positioned on top of spacer 430*a*. Permanent magnet 402 is positioned above disc 426*b*, followed by piezoelectric disc 426*c*, electrically conductive spacer 430*b*, piezoelectric disc 426*d*, and upper conductive spacer 432. Finally, an electrically insulating spacer 434 is positioned between conductive spacer 432 and frame 412. Conductive cap 438 holds this stack against the upper part of frame 412, and is secured by bolt 436. There may be a gap between bolt 436 and the discs (and magnet) in the stack, or an insulator may be provided between the bolt and the discs to prevent the bolt from shorting the discs to frame 412.

Although the stack of piezoelectric and conductive discs and magnet 402 are held in nominally fixed positions, vibrations experienced by the energy harvesting device cause the magnet to move very slightly up or down, serving as a proof mass that applies pressure to the piezoelectric discs in the stack. Bolt 436 has been tightened to preload cap 438 and thereby apply a base amount of pressure to the stack. Consequently, when the device moves and magnet 402 presses upward or downward, it causes the piezoelectric discs to be slightly more or less compressed, thereby generating charge.

For example, when the device moves upward, the magnet presses downward, increasing the compression of piezoelectric discs 426*a* and 426*b*, and decreasing the compression of piezoelectric discs 426*c* and 426*d*. Piezoelectric discs 426*a* and 426*b* are arranged so that this compression causes positive charge to be generated by these discs at the bottom of the stack. At the same time, the decompression of piezoelectric discs 426*c* and 426*d* causes negative charge to be generated by these discs at the top of the stack. Because the piezoelectric discs are separated by conductive spacers (including discs 428, 430, 432 and magnet 402), the piezoelectric discs are effectively connected in series electrically, and the charge is conducted through the stack. Thus, an electrical potential is developed across the stack (with positive potential at the bottom of the stack and negative potential at the top). Conversely, when the device moves downward, the magnet presses upward, decreasing the compression of piezoelectric discs 426*a* and 426*b*, and increasing the compression of discs 426*c* and 426*d*. In this case, discs 426*a* and 426*b* generate negative at the bottom of the stack, and discs 426*c* and 426*d* generate positive charge at the top of the stack. Thus, an electrical potential with the opposite polarity is developed across the stack. Consequently, as the device vibrates up and down, alternating positive and negative voltages are developed across the stack, and AC power is provided to controller 416.

The AC power is communicated to controller 416 through leads 414. Although only two leads are shown in the figure for purposes of clarity, the number of leads will depend upon the specific configuration of the device. In one embodiment, three leads are provided. Two of the leads connect coils 408 to controller 416, and one lead connects the stack including piezoelectric discs 426 to the controller. (Because conductive frame 412 is in contact with the lower end of the stack through conductive cap 438, it is sufficient in this embodiment to connect only the upper end of the stack through a lead 414.) The received charge is processed by the power management circuitry of controller 416, which generates a DC output voltage that is applied to energy store 422 to recharge the energy store.

As noted above, the piezoelectric discs effectively form two different charge generators that are operative in different frequency ranges. In the embodiment of FIG. 4, there are two piezoelectric discs corresponding to each generator. In alternative embodiments, each piezoelectric generator may have more or fewer discs, and the discs may be alternatively positioned within the stack.

The first g piezoelectric generator uses the two discs at the upper end of the stack and the second generator uses the two discs at the lower end of the stack. In this embodiment, the discs at the upper end of the stack are held between magnet 402, which supports the entire horizontal extent of piezoelectric disc 426*c*, and an upper conductive spacer 432, where a portion of the horizontal extent of spacer 432 is held against insulating spacer 434. The frequency range in which the first piezoelectric generator is effective can be altered by changing the portion of conductive spacer 432 that is held against insulating spacer 434. By changing the resonant frequency, the frequency range in which the generator is effective is also changed. This can be used to tune the frequency response of the generator.

The second piezoelectric generator in this embodiment uses the two piezoelectric discs 426*a* and 426*b* at the bottom of the stack. These discs are held between magnet 402, which contacts the entire horizontal extent of piezoelectric disc 426*c*, and a lower conductive support spacer 428, where a portion of the horizontal extent of spacer 428 is held against conductive cap 438. The resonant frequency of the second piezoelectric generator, and consequently the frequency range in which the generator is effective, can be altered by changing the portion of conductive support spacer 428 that is held against cap 438.

The performance of the piezoelectric generators may also be affected by the characteristics of the piezoelectric discs themselves, such as the material and thickness of the discs. Because of the difficulties of using multiple different configurations for the piezoelectric discs (e.g., with respect to manufacturing the discs so that they have different characteristics), it may be impractical to implement frequency range variations in this manner.

The inductive current generator and piezoelectric charge generators of the energy harvesting device are contained within a rigid housing 440. Positive (442) and negative (444) contacts to energy store 422 are provided at the upper and lower ends of the housing, respectively. The housing and contacts have a form factor that is the same as a conventional battery. The form factor may be equivalent to a C cell, D cell, or any other type of conventional battery used in the industry. This form factor allows the energy harvesting device to be installed in a wireless sensor, transmitter, or other battery-operated device in place of a conventional battery without having to modify the device to accommodate the energy harvesting device. The energy harvesting device may therefore serve as a self-replenishing battery or a continuous energy source that does not run down and need to be replaced like conventional batteries when installed in a device in a vibration environment.

The energy harvesting device of FIG. 4, as well as other embodiments disclosed herein are distinctive of conventional devices in various respects. For example, these devices incorporate a combination of multiple different types of generators (e.g., inductive and piezoelectric generators, where prior art devices use a single technology to convert vibration energy to electrical energy. Additionally, the use of multiple generators in the disclosed embodiments enables the energy harvesting devices to convert vibrational energy in a wider range of frequencies than conventional devices. In one embodiment as disclosed in FIG. 4, the induction current generator may be designed to operate optimally in a frequency range from 5-100 Hz while the first piezoelectric generator operates optimally from 100-1000 Hz and the second piezoelectric generator operates optimally in the range from 200-2000 Hz, resulting in an overall effective range from 5-2000 Hz. Another advantage of the disclosed embodiments is that a stationary magnet is used as the proof mass for the piezoelectric generators, which provides a more robust configuration and longer service life, as compared to conventional induction generator designs which use a moving magnet as a proof mass. Another advantage of disclosed embodiments is that the configuration of the housing of the energy harvesting device in a form factor corresponding to a conventional battery enables broad and convenient use of the device as a replacement for a conventional battery, and does not require modification of the device in which it is installed.

As noted above, the embodiments described above are intended to be illustrative, but not limiting of the invention. Alternative embodiments may incorporate different types of electrical energy generators, different numbers of generators, different numbers of discs within piezoelectric generators different arrangements of components, and so on. Many variations will be apparent to those of skill in the art upon reading this disclosure.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the described embodiments. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the described embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed by the claims of the application.

What is claimed is:

1. An energy harvesting apparatus comprising:
    a first electrical generator configured to generate first electrical energy from vibrations in a first frequency range, wherein the first electrical generator comprises an inductive current generator having a magnet that is held in a stationary position within a housing of the energy harvesting apparatus, and a coil positioned within the housing and electrically coupled to an electrical controller, wherein the coil is movable with respect to the magnet in response to the vibrations in the first frequency range, and wherein movement of the coil with respect to the magnet induces current in the coil;
    a second electrical generator configured to generate second electrical energy from vibrations in a second frequency range which is different from the first frequency range, wherein the second electrical generator comprises a piezoelectric charge generator having one or more piezoelectric plates, wherein the magnet provides a proof mass which is positioned to apply pressure to the one or more piezoelectric plates when the proof mass experiences the vibrations in the second frequency range, and wherein the one or more piezoelectric plates are electrically coupled to provide generated charge to the electrical controller;
    an energy store; and
    the electrical controller configured to receive as inputs the first energy received from the first electrical generator and the second energy received from the second electrical generator, wherein the electrical controller is configured to generate output power that is provided to the energy store, thereby charging the energy store.

2. The energy harvesting apparatus of claim 1, wherein the magnet has a cylindrical shape, wherein the coil is wound on a cylindrical support that is coaxially positioned around the magnet.

3. The energy harvesting apparatus of claim 2, wherein the cylindrical support is connected to a frame of the energy harvesting apparatus by one or more springs, wherein the cylindrical support is axially movable with respect to the magnet in response to the vibrations in the first frequency range experienced by the energy harvesting apparatus.

4. The energy harvesting apparatus of claim 3, further comprising a magnetically permeable cylinder coaxially positioned around the cylindrical support, wherein the magnetically permeable cylinder is positioned in fixed relation to the magnet.

5. The energy harvesting apparatus of claim 1, wherein the one or more piezoelectric plates comprise:
    a first set of piezoelectric plates that generate charge responsive to vibrations within the second frequency range of frequencies; and
    a second set of piezoelectric plates that generate charge responsive to vibrations within a third frequency range.

6. The energy harvesting apparatus of claim 1, further comprising one or more conductive spacers positioned between the piezoelectric plates.

7. The energy harvesting apparatus of claim 1, wherein the energy store comprises a rechargeable battery.

8. The energy harvesting apparatus of claim 1, wherein the energy store comprises a supercapacitor.

9. The energy harvesting apparatus of claim 1, further comprising a housing that contains the first electrical generator, the second electrical generator, the energy store, and the electrical controller, wherein a positive electrical contact for the energy store is provided at a first end of the housing and a negative electrical contact for the energy store is provided at a second end of the housing opposite the first end of the housing.

10. The energy harvesting apparatus of claim 1, wherein the housing has a form factor of either a C cell battery or a D cell battery.

11. The energy harvesting apparatus of claim 1, wherein the energy harvesting apparatus is installed in a battery compartment of a wireless sensor.

12. The energy harvesting apparatus of claim 1, wherein the energy harvesting apparatus is installed in a device mounted on a motor and coupled to receive the vibrations in the first and second frequency ranges from the motor.

13. The energy harvesting apparatus of claim 1, wherein the energy harvesting apparatus is positioned in an environment in which the energy harvesting apparatus is subject to vibrational energy from a source external to the energy harvesting apparatus.

14. The energy harvesting apparatus of claim 13, wherein the environment comprises a downhole environment in a well, wherein one or more downhole tools operating in the well generate the vibrations in the first frequency range and the vibrations in the second frequency range.

15. The energy harvesting apparatus of claim 14, wherein the energy harvesting apparatus is secured to the one or more downhole tools operating in the well.

\* \* \* \* \*